(12) United States Patent
Baumann et al.

(10) Patent No.: US 7,285,372 B2
(45) Date of Patent: Oct. 23, 2007

(54) RADIATION-SENSITIVE ELEMENTS AND THEIR STORAGE STABILITY

(75) Inventors: Harald Baumann, Osterode am Harz (DE); Michael Flugel, Osterode am Harz (DE); Udo Dwars, Herzberg am Harz (DE); Eduard Kottmair, Ebenhausen (DE)

(73) Assignee: Kodak Graphic Communications GmbH, Osterode am Harz ( * ) Notice: Subject to any disclaimer, the term of this patent is extended or adjusted under 35 U.S.C. 154(b) by 81 days.

(21) Appl. No.: 10/536,514

(22) PCT Filed: Nov. 28, 2003

(86) PCT No.: PCT/EP03/13431

§ 371 (c)(1),
(2), (4) Date: May 25, 2005

(87) PCT Pub. No.: WO2004/049071

PCT Pub. Date: Jun. 10, 2004

(65) Prior Publication Data

US 2006/0051699 A1 Mar. 9, 2006

(30) Foreign Application Priority Data

Nov. 28, 2002 (DE) ................. 102 55 667

(51) Int. Cl.
*G03F 7/028* (2006.01)
*G03F 7/029* (2006.01)
*G03F 7/027* (2006.01)

(52) U.S. Cl. ............... 430/273.1; 430/281.1; 430/302; 430/18; 430/14; 430/17; 430/276.1; 430/278.1; 430/271.1; 430/309; 430/284.1; 430/285.1; 430/917

(58) Field of Classification Search ............ None
See application file for complete search history.

(56) References Cited

U.S. PATENT DOCUMENTS

| | | | |
|---|---|---|---|
| 3,717,558 A | 2/1973 | McGinniss | |
| 3,907,096 A | 9/1975 | Cioni et al. | |
| 4,355,096 A | 10/1982 | Walls | |
| 4,590,287 A | 5/1986 | Riediker et al. | |
| 4,959,297 A | 9/1990 | Palazzotto | |
| 4,971,892 A | 11/1990 | Ali et al. | |
| 5,086,086 A | 2/1992 | Brown-Wensley et al. | |
| 5,106,722 A | 4/1992 | Husler et al. | |
| 5,795,698 A * | 8/1998 | Fitzgerald et al. | 430/281.1 |
| 6,291,704 B1 | 9/2001 | Anderson et al. | |
| 6,308,001 B1 | 10/2001 | Nair et al. | |
| 2001/0034458 A1 | 10/2001 | Anderson et al. | |
| 2001/0044481 A1 | 11/2001 | Wu et al. | |
| 2001/0053502 A1 | 12/2001 | Wu et al. | |
| 2002/0012516 A1 | 1/2002 | Nair et al. | |
| 2004/0195550 A1* | 10/2004 | Debaud et al. | 252/403 |

FOREIGN PATENT DOCUMENTS

| | | |
|---|---|---|
| DE | 38 32 032 | 9/1988 |
| DE | 40 08 815 | 3/1990 |
| DE | 40 13 358 | 4/1990 |
| DE | 42 17 495 | 5/1992 |
| DE | 44 18645 | 5/1994 |
| EP | 0 122 223 | 2/1984 |
| EP | 0 255 486 | 7/1987 |
| EP | 0 256 981 | 7/1987 |
| EP | 0 269 573 | 11/1987 |
| EP | 0 401 165 | 5/1990 |
| EP | 1 091 247 A2 * | 4/2001 |
| EP | 1 176 007 | 7/2001 |
| GB | 2 198 736 A * | 6/1988 |
| JP | 2001-222101 | 8/2001 |
| WO | 96/34314 | 10/1996 |

OTHER PUBLICATIONS

Machine translation of Akira et al JP 2001-222101 obtained from www.4ipdl.ncipi.go.jp/cgi-bin/tran_web_cgi_ejje?u=http%2F%Fwww4.ipdl.ncip . . . on Sep. 29, 2006.*

* cited by examiner

*Primary Examiner*—Cynthia Hamilton
(74) *Attorney, Agent, or Firm*—J. Lanny Tucker

(57) ABSTRACT

Radiation-sensitive element comprising (a) a substrate with at least one hydrophilic surface and (b) a radiation-sensitive coating on at least one hydrophilic surface of the substrate, wherein the coating comprises: (i) at least one free-radical polymerizable monomer and/or oligomer and/or polymer with at least one ethylenically unsaturated group each, (ii) at least one absorber selected from photoinitiators and sensitizers, which is capable of absorbing radiation of a wavelength in the range of 250 to 1,200 nm and (iii) at least one stabilizer comprising in its molecule at least one group capable of inhibiting free-radical polymerization, and at least one other group capable of sorption at the hydrophilic surface of the substrate.

12 Claims, No Drawings

RADIATION-SENSITIVE ELEMENTS AND THEIR STORAGE STABILITY

The present invention relates to radiation-sensitive elements with excellent storage stability, in particular radiation-sensitive elements comprising a stabilizer in the radiation-sensitive coating, which can be sorbed at the surface of the substrate. The invention furthermore relates to a process for the production of such elements and to a lithographic printing form.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, or is oleophilic, and the non-image area (background) accepts water, or is hydrophilic. The differentiation between image and non-image areas takes place during exposure, for which a film is attached to the printing plate precursor under vacuum in order to guarantee good contact. The plate is then exposed by means of a radiation source, part of which is comprised of UV radiation. When a positive plate is used, the area on the film corresponding to the image on the plate is so opaque that the light does not affect the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Photosensitive mixtures have been used for years in photopolymerizable compositions for the production of photosensitive materials such as e.g. printing plates. However, an improved sensitivity in particular in the visible spectral range is required for new and advanced applications (e.g. exposure by means of lasers) so that the exposure time can be shortened. From an economic point of view it is also important that low-intensity lasers can be used, which are less expensive and more reliable than high-intensity lasers. Therefore, efforts have been made for some time to increase the sensitivity of photosensitive mixtures to be used in photopolymerizable compositions.

It is known that the free-radical polymerization of ethylenically unsaturated compounds can be initiated by irradiation with visible light in the presence of photoreducible dyes and reducing agents, e.g. amines (U.S. Pat. No. 3,097,096). EP-A-122 223 discloses photoinitiators and photopolymerizable compositions comprising metallocenes. The use of such metallocenes resulted in an increase in the sensitivity of the photopolymerizable layer and thus a reduction of the necessary irradiation time and the required power of the radiation source. Attempts were also made to obtain improved results from the use of metallocenes that had been modified further, e.g. in the documents EP-A-401 165, U.S. Pat. No. 4,590,287, EP-A-255 486, EP-A-256 981 and U.S. Pat. No. 5,106,722.

Document DE-A-40 08 815 describes a photopolymerizable mixture comprising a polymeric binder, a free-radical polymerizable compound with at least one polymerizable group and at least one photooxidizable group in the molecule and a metallocene compound as photoinitiator.

In order to further improve sensitivity, it was tried to use the metallocene compound together with a coinitiator. For example, EP-B-269 573 discloses liquid mixtures of photoinitiators which are solutions of titanocene compounds in liquid photoinitiators of the type α-hydroxy- and α-aminoacetophenone derivatives. DE-A-38 32 032 describes a photopolymerizable mixture comprising a polymeric binder, a free-radical polymerizable compound with at least one polymerizable group, a photoreducible dye, and, as initiator, a metallocene as well as a coinitiator. The coinitiator is a trihalogenomethyl compound divisible by radiation, which is intended to increase photosensitivity. Compounds with a triazine ring in the parent substance carrying two trihalogenomethyl groups are preferred.

DE-A40 13 358 describes a specific process for the production of printing forms or photoresists using metallocene compounds as photoinitiator, which is aimed at an improvement of sensitivity.

U.S. Pat. No. 3,717,558 describes metallocenes of subgroup elements in combination with a further photoinitiator comprising an activated halogen-containing group for the use in photopolymerizable recording materials. However, these initiator combinations are very sensitive to oxygen and hydrolysis and are therefore not very suitable for the production of printing plates and resist materials.

The use of a combination of specific organometal compounds and onium salts in a hardening agent for polymerizable compounds is also known (U.S. Pat. No. 5,086,086). As metallocene compound, organometal compounds are used whose essential feature is that they comprise at least one metal-metal sigma bond, i.e. that at least two transition-metal atoms are present in one complex. The hardening agents described in U.S. Pat. No. 5,086,086 are not used together with dyes for light-induced polymerization.

U.S. Pat. No. 4,971,892 discloses photopolymerizable compositions which are particularly suitable for printing plates and are said to exhibit a high degree of sensitivity to visible light. As initiator systems for free-radical polymerization, these photopolymerizable compositions comprise an initiator selected from diaryliodonium salts, halogenated triazines and triarylsufonium salts, as well as a specific merocyanine dye.

U.S. Pat. No. 4,959,297 is directed to photopolymerizable compositions comprising at least one vinyl monomer capable of undergoing free-radical polymerization, a photoinitiator system, a diaryliodonium salt, a pigment, one or more electron donating compounds and additives. Finally, DE-A-4,217,495 discloses a photopolymerizable mixture and a recording material produced therefrom.

DE-A-4,418,645 describes a photosensitive mixture comprising a binder, one or more polymerizable compounds with at least one polymerizable group and one or more dyes absorbing in the range of 250 nm to 700 nm, as well as an initiator system comprising at least one metallocene compound and at least one onium compound.

WO 96/34314 describes negative working lithographic printing plates comprising an overcoat on their photosensitive coating, which overcoat comprises a quenching agent bonded to a polymer which can deactivate free radicals. The quenching agent preferably comprises a nitryl function such as e.g. a TEMPO group (2,2,6,6-tetramethyl-1-piperidinyloxy). However, the attained storage stability in combination with good sensitivity does not meet the high standards required in practical applications.

The use of free-radical scavengers such as e.g. TEMPO in light-hardenable compositions is furthermore known from the documents U.S. Pat. No. 6,291,704, U.S. Pat. No. 6,308,001, US-A-01 0044481, US-A-01 0053502, US-A-02 0012516 and US-A-01 0034458. However, here as well the balance between storage stability on the one hand and sensitivity and resolution on the other hand is not satisfactory.

JP-A-2001-222101 describes photosensitive compositions comprising a nitroxyl compound and a sensitizer system comprising a borate complex and a dye. Various TEMPO derivatives are listed as suitable nitroxyl compounds.

It is the object of the present invention to provide novel radiation-sensitive elements exhibiting improved properties compared to the ones known in the prior art, in particular high photosensitivity, a high degree of thermal stability, high resolution in combination with good storage stability, and—in the case of printing plates—yielding a large number of copies on the printing machine.

The problem underlying the invention is solved by a radiation-sensitive element comprising
   (a) a substrate with at least one hydrophilic surface and
   (b) a radiation-sensitive coating on at least one hydrophilic surface of the substrate, wherein the coating comprises:
      (i) at least one free-radical polymerizable monomer and/or oligomer and/or polymer with at least one ethylenically unsaturated group each,
      (ii) at least one absorber selected from polymerization initiators and sensitizers, which is capable of absorbing radiation of a wavelength in the range of 250 to 1,200 nm,
      (iii) at least one stabilizer comprising in its molecule at least one group capable of inhibiting free-radical polymerization, and at least one other group capable of sorption at the hydrophilic surface of the substrate.

Unless defined otherwise, the terms "alkyl group, alkanediyl group or alkyl unit of an aralkyl group" as used in the present invention refer to a straight-chain, branched or cyclic saturated hydrocarbon group, which optionally comprises one or more substituents selected from halogen atoms, $C_1$-$C_{12}$ alkyl,

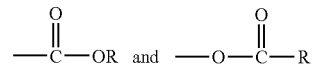

(wherein R is selected from $C_1$-$C_{12}$ alkyl).

It is essential for the present invention that the radiation-sensitive coating comprise one or more stabilizers, which comprise two kinds of functional groups in one molecule:

1. a functional group capable of inhibiting free-radical polymerization (in the following also referred to simply as "inhibitor group") and
2. a functional group capable of sorption at the hydrophilic surface of the substrate (in the following also referred to simply as "sorption group").

Within the framework of the present invention, the term "sorption" encompasses absorption, adsorption and chemisorption.

The stabilizer can be a monomeric or polymeric compound.

The inhibitor group is preferably derived from stable free radicals such as e.g. nitroxyl radicals, mono-, di- or trihydroxy aromatics (e.g. derived from hydroquinone, hydroquinone monomethylester and phenols with sterically superior substituents in the 2- or 2- and 6-positions), quinones (e.g. derived from 1,2- or 1,4-benzoquinone), nitroso compounds (e.g. derived from nitrosobenzene, nitrosodurene and nitroso-tert.-butane) and mixtures thereof.

An especially preferred inhibitor group is represented by the following formula:

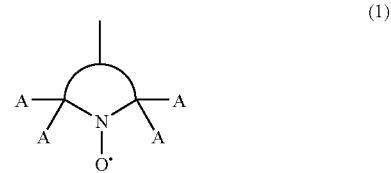

wherein each A is independently selected from $C_1$-$C_{10}$ alkyl (preferably $C_1$-$C_3$); the alkyl group can optionally be substituted with one or more (preferably one) substituents selected from halogen atoms or $C_1$-$C_{10}$ alkoxy.

The nitroxyl function is part of a 5- or 6-membered heterocyclic ring, which optionally comprises one or more (preferably no or one) double bonds and optionally contains, in addition to the nitrogen atom of the nitroxyl group, one or more (preferably one) further heteroatoms selected from O, S, and N (preferably O or N).

In an especially preferred embodiment the preferred inhibitor group of formula (I) is selected from:

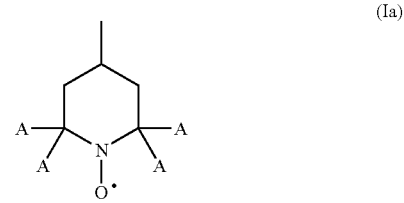

-continued

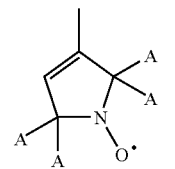
(Ib)

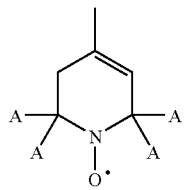
(Ic)

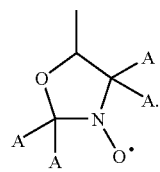
(Id)

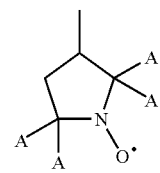
(Ie)

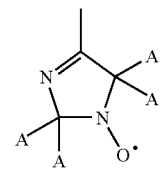
(If)

The sorption group is preferably selected from P—OH-containing groups; especially preferred are:

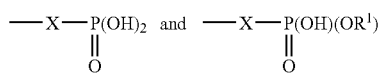

wherein $R^1$ is selected from $C_1$-$C_{18}$ alkyl, $C_7$-$C_{11}$ aralkyl and $C_6$-$C_{10}$ aryl and mixtures thereof, and X represents a single bond, —O—, —NH or —N($C_1$-$C_{10}$ alkyl)-.

$R^1$ is preferably $C_1$-$C_6$ alkyl, $C_7$ aralkyl or $C_6$ aryl; preferably, X is —O—.

According to a preferred embodiment, the sorption group is

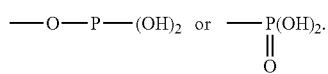

If the stabilizer is a monomeric compound, it is preferably selected from compounds of formula (M1) and mixtures thereof.

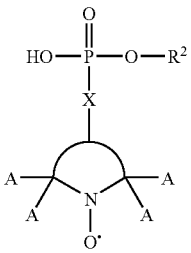
(M1)

wherein X is as defined above, $R^2$ represents hydrogen, $C_1$-$C_{18}$ alkyl, $C_7$-$C_{18}$ aralkyl, $C_6$-$C_{10}$ aryl or

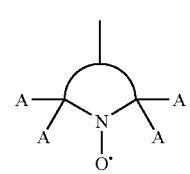
(I)

each group A is as defined above and the nitroxyl function is part of a 5- or 6-membered heterocyclic ring, which optionally comprises one or more (preferably no or one) double bonds and optionally contains, in addition to the nitrogen atom of the nitroxyl group, one or more further heteroatoms selected from O, S, and N (preferably no additional heteroatom or one selected from O or N). If $R^2$ represents a group of formula (I), it is preferably selected from formulas (Ia) to (If) as shown above in connection with the inhibitor group.

In a stabilizer according to formula (M1), $R^2$ is preferably $C_1$-$C_6$ alkyl, $C_7$ aralkyl or $C_6$-aryl or a hydrogen atom, especially preferred, $R^2$ is a hydrogen atom. With respect to A, it is preferred that all groups A be identical, preferably methyl groups.

However, the stabilizer can also be a polymeric compound, wherein at least one sorption group and at least one inhibitor group are bonded to its polymeric parent structure.

A polymeric stabilizer is preferable a copolymer obtained by polymerization of at least one of the following monomers: Fumaric acid, maleic acid anhydride (preferably decyclized with $C_1$-$C_{10}$ alcohols), ethylene, propylene, acrylic acid esters (preferably $C_1$-$C_{10}$ alkyl ester), methacrylic acid esters (preferably $C_1$-$C_{10}$ alkyl ester), vinyl esters (preferably vinyl acetate), vinyl alcohol and styrene with at least one copolymerizable monomer substituted with a sorption group and at least one polymerizable monomer substituted with an inhibitor group.

The structural unit of the polymeric stabilizer carrying the sorption group preferably comprises P—OH-containing groups; the following structural units are especially preferred:

(PSA₁)
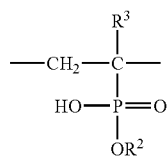

(PSA₂)
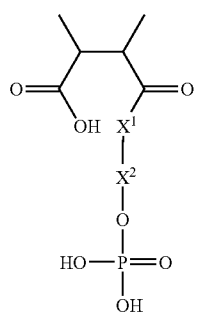

(PSA₃)
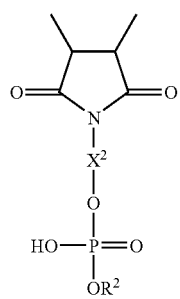

(PSA₄)
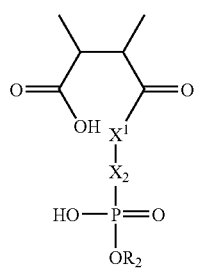

(PSA₅)
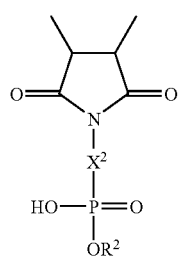

wherein $X^2$ is $C_1$-$C_{12}$ alkanediyl or $C_6$-$C_{10}$ arylene, $R^3$ is $C_1$-$C_{12}$ alky, $X^1$ is selected from —O—, —NH— and —N($C_1$-$C_{10}$ alkyl) and $R^2$ is as defined above.

$X^2$ is preferably $C_2$-$C_6$ alkanediyl.

$R^3$ is preferably —$CH_3$.

$X^1$ preferably represents —O—.

$R^2$ is preferably hydrogen, $C_1$-$C_6$ alkyl, $C_7$ aralkyl and $C_6$ aryl, especially preferred hydrogen.

If $X^1$ is —N($C_1$-$C_{10}$ alkyl), the alkyl group preferably comprises 1 to 4 carbon atoms.

In a preferred embodiment, the sorption group of the polymeric stabilizer is represented by the formula $PSA_1$.

The structural unit of the polymeric stabilizer carrying the inhibitor group is preferably selected from:

(PI₁)
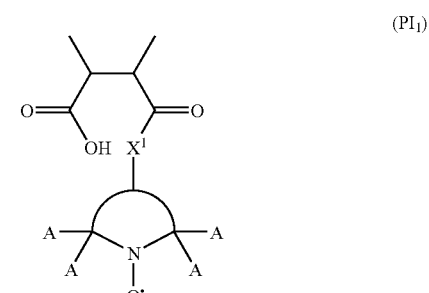

(PI₂)
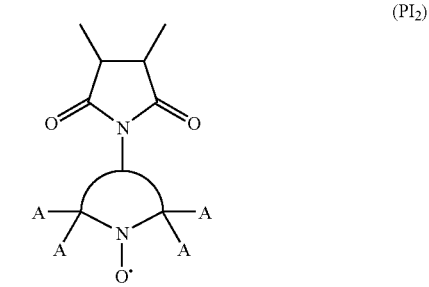

(PI₃)
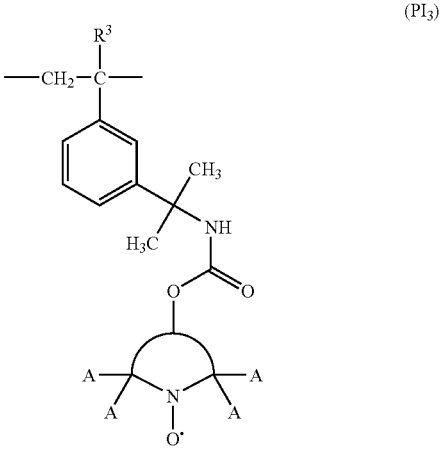

-continued

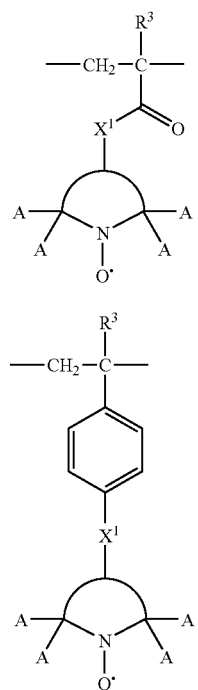

wherein A is defined as above with respect to a monomeric stabilizer, $X^1$ and $R^3$ are as defined above with respect to the sorption group, and the nitroxyl function is part of a 5- or 6-membered heterocyclic ring, which optionally comprises one or more double bonds and optionally contains, in addition to the nitrogen atom of the nitroxyl group, one or more further heteroatoms selected from O, S, and N.

In a preferred embodiment, the inhibitor group of the polymeric stabilizer is represented by the formula $PI_1$.

It is preferred that at least 80 wt.-% of the stabilizer (iii) sorb at the hydrophilic substrate surface, especially preferred at least 90 wt.-%, and most preferred at least 95 wt.-%.

According to a preferred embodiment, the sorption is an absorption or a chemisorption.

Spectroscopic testing indicates that the stabilizer is sorbed at the substrate surface; preferably, at least 80 wt.-% of the stabilizer are sorbed at the hydrophilic substrate surface, especially preferred at least 90 wt.-%, and most preferred more than 95 wt.-%.

No concentration of the stabilizer at the surface of the radiation-sensitive coating or migration of the stabilizer to an optionally present oxygen-impermeable overcoat takes place, which is confirmed in spectroscopic tests.

All monomers, oligomers and polymers with C—C double bonds which are free-radical polymerizable and comprise at least one C—C double can be used as ethylenically unsaturated monomers, oligomers and polymers. Monomers, oligomers and polymers with C—C triple bonds can also be used, but they are not preferred. Suitable compounds are well known to the person skilled in the art and can be used in the present invention without any particular limitations. Esters of acrylic and methacrylic acids, itaconic acid, crotonic acid, isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and methacrylate, pentaerythrite triacrylate and methacrylate, dipentaerythritemonohydroxy pentaacrylate and methacrylate, dipentaerythrite hexaacrylate and methacrylate, pentaerythrite tetraacrylate and methacrylate, ditrimethylol propane tetraacrylate and methacrylate, diethyleneglycol diacrylate and methacrylate, triethyleneglycol diacrylate and methacrylate or tetraethyleneglycol diacrylate and methacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride olefin copolymers and hydroxyalkyl(meth)acrylates; polyesters comprising an allylalcoholester group; reaction products of polymeric polyalcohols and isocyanato(meth)acrylates; unsaturated polyesters; (meth)acrylate-terminated polystyrenes, poly(meth)acrylic acid ester, poly(meth)acrylic acids, poly(meth)acrylamides and polyethers. In this connection, the prefix "(meth)" indicates that both derivatives of acrylic acid and of methacrylic acid can be used.

Additional suitable C—C unsaturated free-radical polymerizable compounds are described e.g. in EP-A-1 176 007.

It is of course possible to use different kinds of monomers, oligomers or polymers in the mixture; furthermore, mixtures of monomers and oligomers and/or polymers can be used, as well as mixtures of oligomers and polymers. The free-radical polymerizable monomers, oligomers or polymers are preferably present in an amount of 35 to 90 wt.-%; if monomers/oligomers are used, 45 to 60 wt.-%, based on the dry layer weight of the IR-sensitive coating, are especially preferred.

In the present invention, a photoinitiator is a compound capable of absorbing radiation when exposed and of forming free radicals by itself, i.e. without the addition of coinitiators. Examples of suitable photoinitiators include triazine derivatives with 1 to 3 $CX_3$ groups (wherein every X is independently selected from a chlorine or bromine atom, and is preferably a chlorine atom), hexaarylbisimidazole compounds, benzoin ethers, benzyl ketals, oxime ethers, oxime esters, α-hydroxy- or α-amino-acetophenones, acylphosphines, acylphosphine oxides, acylphosphine sulfides, metallocenes, peroxides etc. Examples of suitable triazine derivatives include 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, and 2-(4-ethoxy-naphtho-1-yl)-4,6-bis(trichloromethyl)-s-triazine and 2-[4-(2-ethoxyethyl)-naphtho-1-yl]-4,6-bis (trichloro-methyl)-s-triazine. Suitable oxime ethers and oxime esters are for example those derived from benzoin. Preferred metallocenes are for example titanocenes with two five-membered cyclodienyl groups such as e.g. cyclopentadienyl groups and one or two six-membered aromatic groups having at least one ortho-fluorine atom and optionally also one pyrryl group; most preferred metallocenes are bis(cyclopentadienyl)-bis-[2,6-difluoro-3-(pyrr-1-yl)-phenyl]titanium and dicyclopentadiene-bis-2,4,6-trifluorophenyl-titanium or zirconium.

In the present invention, a single photoinitiator or a mixture of two or more can be used.

The photoinitiators can be used alone or in combination with one or more coinitiators; the addition of coinitiators can increase the effectiveness of the photoinitiation.

The amount of photoinitiator(s) is not particularly restricted; however, if photoinitiators are present, it is preferably in the range of 0.2 to 25 wt.-%, based on the dry layer weight, especially preferred 0.5 to 15 wt.-%.

A sensitizer as referred to in the present invention is a compound which can absorb radiation when it is exposed but which cannot by itself, i.e. without the addition of coinitiators, form free radicals.

All light-absorbing compounds that are photooxidizable or photoreducible or capable of transferring their excitation energy to receptor molecules are suitable sensitizers for use in the present invention. Examples of such dyes include cyanine dyes, merocyanine dyes, oxonol dyes, diarylmethane dyes, triarylmethane dyes, xanthene dyes, coumarin derivatives, ketocoumarin dyes, acridine dyes, phenazine dyes, quinoxaline dyes, pyrrylium dyes or thiapyrrylium dyes, azaanulene dyes (such as phthalocyanines and porphyrines), indigo dyes, anthraquinone dyes, polyarylenes, polyarylpolyenes, 2,5-diphenylisobenzofuranes, 2,5-diarylfuranes, 2,5-diarylthiofuranes, 2,5-diarylpyrroles, 2,5-diarylcyclopentadienes, polyarylphenylenes, polyaryl-2-pyrazolines, carbonyl compounds such as aromatic ketones or quinones, e.g. benzophenone derivatives, Michler's ketone, thioxanthone derivatives, anthraquinone derivatives and fluorenone derivatives.

In the present invention, one sensitizer or a mixture of two or more can be used.

The sensitizers are used in combination with one or more coinitiators. Additionally, photoinitiators can be used; however, this is not preferred.

The amount of sensitizer(s) is not particularly restricted; however, if sensitizers are present, it is preferably in the range of 0.2 to 15 wt.-%, based on the dry layer weight, especially preferred 0.5 to 10 wt.-%. If both photoinitiators and sensitizers are present in the coating, their total amount is preferably 0.5 to 30 wt.-%, based on the dry layer weight, especially preferred 1 to 15 wt.-%.

A coinitiator as referred to in the present invention is a compound that is essentially unable to absorb when exposed and forms free radicals together with the light-absorbing sensitizers. Coinitiators suitable for use in the present invention include e.g. amines such as alkanol amines or 4-dialkylaminebenzoic acid esters, diaryliodonium salts, triarylsulforium salts, aryldiazonium salts, N-arylglycine derivatives, diaryldiiminodiacetic acid compounds, aryloxyacetic acid, aromatic sulfonyl halides, trihalomethylsulfones, nitrogen heterocycles with N-oxide substituents (such as alkoxy pyridinium salts), nitrogen heterocycles such as N-benzoyloxyphthalimide, diazosulfonates, 9,10-dihydroanthracene derivatives, thiol compounds (e.g. mercaptobenzthiazole, mercaptobenzimidazole and mercaptotriazole), triazine derivatives with 1 to 3 $CX_3$ groups (wherein every X is independently selected from a chlorine or bromine atom, and is preferably a chlorine atom), hexaarylbisimidazole compounds, benzoin ethers, benzyl ketals, oxine ethers, oxime esters, α-hydroxy- or α-amino-acetophenones, acylphosphines, acylphosphine oxides, acylphosphine sulfides, metallocenes, peroxides etc., carbonyl compounds such as aromatic ketones or quinones, e.g. benzophenone derivatives, Michler's ketone, thioxanthone derivatives, anthraquinone derivatives and fluorenone derivatives.

Many coinitiators can also function as photoinitiators when they are exposed in their absorption band. This way, photosensitive layers can be obtained that are e.g. sensitive over a wide spectral range because a photoinitiator or sensitizer covers the long-wavelength spectral range (IR and/or visible range) and a coinitiator covers the short-wavelength spectral range (e.g. the UV range). This effect can be advantageous if the consumer wants to irradiate the same material with different radiation sources. For example, the coinitiator can function as an actual coinitiator in the sense of the definition given above for the IR or visible range, while it functions as a photoinitiator for the UV range.

In the present invention, one coinitiator or a mixture of coinitiators can be used.

The amount of coinitiator(s) is not particularly restricted; however, it is preferably in the range of 0.2 to 25 wt.-%, based on the dry layer weight, especially preferred 0.5 to 15 wt.-%.

Optionally, the radiation-sensitive coating of the present invention can also comprise a binder or a mixture of binders. The binder is preferably selected from polyvinyl acetals, acrylic polymers and polyurethanes. It is preferred that the binder contains acid groups, especially preferred carboxy groups. Most preferred are acrylic polymers. Binders with acid groups preferably have acid numbers in the range of 20 to 180 mg KOH/g polymer. Optionally, the binder can comprise unsaturated groups in the main chain or the side chains. Such unsaturated bonds are capable of undergoing a free-radical photopolymerization reaction or another photoreaction such as e.g. a 2+2-photocycloaddition.

The radiation-sensitive coating can optionally also comprise small amounts of a thermopolymerization inhibitor which is not suitable for sorption at the hydrophilic surface of the substrate. Suitable examples of polymerization inhibitors include hydroquinone, p-methoxyphenol, di-t-butyl-p-cresol, pyrrogallol, t-butylcatechol, benzoquinone, 4,4'-thio-bis-(3-methyl-6-t-butylphenol), 2,2'-methylene-bis-(4-methyl-6-t-butylphenol) and N-nitrosophenylhydroxylamine salts. The amount of the non-absorbable polymerization inhibitor in the radiation-sensitive coating is preferably 0 to 5 wt.-%, based on the dry layer weight, especially preferred 0.01 to 2 wt.-%. Such inhibitors are often introduced into the radiation-sensitive coating via commercial monomers or oligomers and are therefore not expressly mentioned.

Furthermore, the radiation-sensitive coating of the present invention can comprise dyes or pigments for coloring the layer. Examples of colorants include e.g. phthalocyanine pigments, azo pigments, carbon black and titanium dioxide, ethyl violet, crystal violet, azo dyes, anthraquinone dyes and cyanine dyes. The amount of colorant is preferably 0 to 20 wt.-%, based on the dry layer weight, especially preferred 0.5 to 10 wt.-%.

For improving the physical properties of the hardened layer, the radiation-sensitive coating can additionally comprise further additives such as plasticizers or inorganic fillers. Suitable plasticizers include e.g. dibutyl phthalate, dioctyl phthalate, didodecyl phthalate, dioctyl adipate, dibutyl sebacate, triacetyl glycerin and tricresyl phosphate. The amount of plasticizer is not particularly restricted, however, it is preferably 0 to 10 wt.-%, based on the dry-layer weight, especially preferred 0.25 to 5 wt.-%.

The radiation-sensitive coating can also comprise known chain transfer agents such as e.g. mercapto compounds. They are preferably used in an amount of 0 to 15 wt.-%, based on the dry layer weight, especially preferred 0.5 to 5 wt.-%.

Furthermore, the radiation-sensitive coating can comprise leuco dyes such as e.g. leuco crystal violet and leucomalachite green. They are preferably present in an amount of 0 to 10 wt.-%, based on the dry layer weight, especially preferred 0.5 to 5 wt.-%.

Additionally, the radiation-sensitive coating can comprise surfactants. Suitable surfactants include siloxane-containing polymers, fluorine-containing polymers and polymers with ethylene oxide and/or propylene oxide groups. They are preferably present in an amount of 0 to 10 wt.-%, based on the dry layer weight, especially preferred 0.2 to 5 wt.-%.

Further optional components of the radiation-sensitive coating include inorganic fillers such as e.g. $Al_2O_3$ and $SiO_2$. They are preferably present in an amount of 0 to 20 wt.-%, based on the dry layer weight, especially preferred 0.1 to 5 wt.-%.

The radiation-sensitive elements of the present invention can for example be printing plate precursors (in particular precursors of lithographic printing plates), printed circuit boards for integrated circuits or photomasks.

A dimensionally stable plate or foil-shaped material is preferably used as a substrate in the production of printing plate precursors. Preferably, a material is used as dimensionally stable plate or foil-shaped material that has already been used as a substrate for printing matters. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability; is inexpensive and furthermore exhibits excellent adhesion to the coating. Furthermore, a composite film can be used wherein an aluminum foil has been laminated onto a polyethylene terephthalate film.

It is important in the present invention that the substrate has a hydrophilic surface on one side; substrates having a hydrophilic surface on their front and back sides can also be used in the present invention. The hydrophilic nature of the surface can be an inherent property of the substrate material itself, or be generated by treating the substrate surface with suitable substances known to the person skilled in the art. A substrate that exhibits a low degree of hydrophilia which is reinforced by the surface treatment is also encompassed by the present invention.

A metal substrate, in particular an aluminum substrate, is preferably subjected to at least one treatment selected from roughening (e.g. by brushing in a dry state or brushing with abrasive suspensions, or electrochemical roughening, e.g. by means of a hydrochloric acid electrolyte), anodic oxidation and application of a hydrophilizing layer.

In order to improve the hydrophilic properties of the surface of the metal substrate that has been roughened and optionally anodically oxidized in sulfuric acid or phosphoric acid, the metal substrate can be subjected to an aftertreatment with an aqueous solution of sodium silicate, calcium zirconium fluoride, polyvinylphosphonic acid or phosphoric acid. Within the framework of the present invention, the term "substrate" also encompasses an optionally pre-treated substrate exhibiting, for example, a hydrophilizing layer on its surface.

The details of the above-mentioned substrate pre-treatment are known to the person skilled in the art.

The radiation-sensitive coating of the present invention is applied to the hydrophilic surface of the substrate by means of common coating processes. If both the front and the back sides of the substrate have a hydrophilic surface, a radiation-sensitive coating can be applied on both sides; in the elements according to the present invention it is preferred that a radiation-sensitive coating is only applied to one side of the substrate.

The radiation-sensitive elements of the present invention can be prepared as follows:

By means of known coating processes (e.g. centrifugal coating, dip coating, coating by means of doctor blades), a radiation-sensitive mixture comprising (i) at least one free-radical polymerizable monomer and/or oligomer and/or polymer with at least one ethylenically unsaturated group each, (ii) at least one absorber selected from polymerization initiators and sensitizers, which is capable of absorbing radiation of a wavelength in the range of 250 to 1,200 nm, (iii) at least one stabilizer comprising in its molecule at least one group capable of sorption at the hydrophilic surface of the substrate and at least one group capable of inhibiting free-radical polymerization, (iv) a solvent or solvent mixture, and (v) optionally at least one additive selected from coinitiators, which form free radicals after the excitation of the initiator or sensitizer with radiation of a wavelength of 250 to 1,200 nm, alkali-soluble binders, dyes, plasticizers, chain transfer agents, leuco dyes, inorganic fillers, surfactants and polymerization inhibitors not suitable for sorption at the surface of the substrate is applied on the hydrophilic surface of the substrate.

Spectroscopic testing has shown that the stabilizer is concentrated at the substrate surface; in a preferred embodiment, at least 80 wt.-% of the stabilizer are concentrated at the hydrophilic substrate surface, especially preferred at least 90 wt.-%, and most preferred more than 95 wt.-%.

If both the front and the back sides of the substrate have a hydrophilic surface, a radiation-sensitive coating can be applied on both sides, if desired.

Afterwards, the element is dried and an oxygen-impermeable overcoat is optionally applied by means of known processes.

Suitable solvents include low alcohols (e.g. methanol, ethanol, propanol and butanol), glycolether derivatives (e.g. ethyleneglycol monomethylether, propyleneglycol monomethylether, ethyleneglycol monomethylether acetate and propyleneglycol monomethyl-ether acetate), ketones (e.g. methyl ethyl keton, methyl isobutyl keton), esters (e.g. ethyl acetate and butyl acetate), aromatics (e.g. toluene and xylene) and dipolar aprotic solvents (e.g. THF, dimethylformamide and N-methylpropyrrolidone). The solids content of the radiation-sensitive mixture to be applied depends on the coating method that is used and is preferably 1 to 20 wt.-%.

Alternatively, the radiation-sensitive elements can be prepared according to the following two-step coating process:

In a first step, a mixture that is not radiation-sensitive and comprises at least one solvent and at least one stabilizer comprising in its molecule at least one group capable of sorption at the hydrophilic surface of the substrate and at least one group capable of inhibiting free-radical polymerization is applied. The term "mixture that is not radiation-sensitive" refers to a mixture comprising neither photoinitiators nor sensitizers nor coinitiators.

After drying, a radiation-sensitive mixture comprising
(i) at least one free-radical polymerizable monomer and/or oligomer and/or polymer with at least one ethylenically unsaturated group;
(ii) at least one absorber selected from polymerization initiators and sensitizers, which is capable of absorbing radiation of a wavelength in the range of 250 to 1,200 nm;
(iii) a solvent or solvent mixture, and
(iv) optionally at least one additive selected from coinitiators, which form free radicals after the excitation of the initiator or sensitizer with radiation of a wavelength of 250 to 1,200 nm, alkali-soluble binders, dyes, plasticizers, chain transfer agents, leuco dyes, inorganic fillers, surfactants and polymerization inhibitors not suitable for sorption at the surface of the substrate is applied thereon in a second coating step.

In this two-step process as well, the substrate can optionally be coated on both sides and an oxygen-impermeable overcoat can be applied on the dried radiation-sensitive coating.

Spectroscopic testing has shown that the stabilizer is not homogeneously dispersed in the radiation-sensitive mixture when it is applied; preferably, at least 80 wt.-% of the stabilizer used remains on the substrate surface, especially preferred at least 90 wt.-%, and most preferred more than 95 wt.-%.

The radiation-sensitive coating of the radiation-sensitive elements according to the present invention can consist of several "layers". It is not necessary for all components of the radiation-sensitive coating to be uniformly dispersed throughout the entire thickness of the radiation-sensitive coating; for instance, the stabilizer sorbed at the substrate surface is also considered part of the radiation-sensitive coating.

The additional application of a water-soluble oxygen-impermeable overcoat onto the radiation-sensitive layer can be advantageous. The polymers suitable for such an overcoat include, inter alia, polyvinyl alcohol, polyvinyl alcohol/polyvinyl acetate copolymers, polyvinyl pyrrolidone, polyvinyl pyrrolidone/polyvinyl acetate copolymers and gelatin. Preferably, the composition for the oxygen-impermeable overcoat is applied in the form of a solution in water or in a solvent miscible with water; in any case, the solvent is selected such that the radiation-sensitive coating already present on the substrate does not dissolve. The layer weight of the overcoat can e.g. be 0.1 to 4 g/m², preferably 0.3 to 3 g/m². However, the printing plate precursors according to the present invention show excellent properties even without an overcoat. The overcoat can also comprise matting agents (i.e. organic or inorganic particles with a particle size of 2 to 20 µm) which facilitate the planar positioning of the film during contact exposure. If an overcoat is present, it is essentially free of the stabilizers used in the present invention. The overcoat according to the present invention is permeable for radiation; essentially no photochemical reactions take place in this layer, which also distinguishes this layer from the radiation-sensitive coating.

The thus produced printing plate precursors are image-wise exposed in a manner known to the person skilled in the art with radiation of an appropriate wavelength and subsequently developed with a commercially available aqueous alkaline developer. After image-wise exposure, i.e. prior to developing, a heat treatment at 50 to 180° C., preferably 90 to 150° C., can be carried out. The developed plates can be treated with a preservative ("gumming") using a common method. The preservatives are aqueous solutions of hydrophilic polymers, wetting agents and other additives.

For certain applications, it is furthermore advantageous to increase the mechanical strength of the printing layers by subjecting them to a heat treatment (what is referred as "baking") and/or a combination of baking and overall exposure (e.g. to UV light). For this purpose, prior to the treatment, the plate is treated with a solution that protects the non-image areas such that the heat treatment does not cause these areas to accept ink. A solution suitable for this purpose is e.g. described in U.S. Pat. No. 4,355,096. Baking takes place at a temperature in the range of 150 to 250° C. However, printing plates prepared from printing plate precursors according to the present invention show excellent properties even without having been subjected to a heat treatment. When both baking and overall exposure are carried out, the two treatment steps can be performed simultaneously or one after the other.

Lithographic printing plate precursors according to the present invention are characterized by improved photosensitivity in combination with good storage stability; the developed printing plates exhibit excellent abrasion resistance which allows a large number of copies.

The invention will be explained in more detail in the following examples.

EXAMPLES

Preparation Example 1

13.54 g vinylphosphonic acid (0.125 mole), 12.26 g maleic acid anhydride (0.125 mole), 25.03 g methylmethacrylate (0.25 mole) and 0.25 g AIBN (0.0015 mole) were dissolved in 65 g methyl ethyl ketone. The solution was stirred and heated in a nitrogen atmosphere for 8 hours. The solids content of the solution was 38.2 wt.-%. 0.35 g 4-amino-TEMPO were added to 2.2.8 g of this solution and the solution was heated to 60° C. for three hours under stirring. Then 0.0045 g pure methylamine (a corresponding amount of a 2 molar solution of TMF was used) were added and the solution was held at a temperature of 60° C. for another hour. The solution was stored in a refrigerator until it was used.

Examples 1 to 4 and Comparative Examples 1 to 12

An electrochemically roughened and anodized aluminum foil was subjected to a treatment with an aqueous solution of polyvinyl phosphonic acid (PVPA) and was coated, after drying, with an aqueous solution as described in Table 1 and dried; a lithographic printing plate precursor was obtained.

TABLE 1

| Coating solution | |
|---|---|
| 0.82 g | of a terpolymer prepared by polymerizing 476 parts by weight styrene, 476 parts by weight methylmethacrylate and 106 parts by weight methacrylic acid |
| 0.1 g | Kayamer PM-2 (1 mole phosphoric acid esterified with 1.5 moles hydroxyethylmethacrylate from Coa Corp. Ltd., Japan) |
| 0.2 g | mercapto-3-triazole |
| 3.58 g | of an 80% methyl ethyl ketone solution of a urethane acrylate prepared by reacting Desmodur N100 ® |

TABLE 1-continued

| | Coating solution |
|---|---|
| | (available from the company Bayer) with hydroxy ethyl acrylate and pentaerythritol triacrylate; double-bond content: 0.50 double bonds/100 g when all isocyanate groups have reacted with the acrylates comprising hydroxyl groups |
| 0.41 g | ditrimethylolpropane tetraacrylate |
| 1.25 g | of a dispersion in propyleneglycol monomethylether comprising 7.25 wt-% copper phthalocyanine and 7.25 wt.-% polyvinylacetal binder comprising 39.9 mole-% vinyl alcohol groups, 1.2 mole-% vinyl acetate groups, 15.4 mole-% acetal groups derived from acetaldehyde, 36.1 mole-% acetal groups derived from butyric aldehyde and 7.4 mole-% acetal groups derived from 4-formylbenzoic acid |
| 0.115 g | bis(cyclopentadienyl)-bis-[2,6-difluoro-3-(pyrr-1-yl)-phenyl]titanium |
| 0.16 g | diphenyliodonium chloride |
| 0.15 g | ethyleosin |
| X g | additive according to Table 2 |
| 45 ml | propyleneglycol monomethylether |
| 5 ml | acetone |

The solution was filtered, applied to the pretreated substrate and the coating was dried for 5 minutes at 90° C. The dry layer weight of the photopolymer layer was about 2 g/m².

The obtained samples were coated with an overcoat by applying an aqueous solution of poly(vinylalcohol) (Airvol 203 available from Airproducts; degree of hydrolysis: 88%). After drying for 5 minutes at 90° C., the overcoat had a dry layer weight of about 3 g/m².

The printing plate precursor was exposed to the light of a tungsten lamp having a metal interference filter for 532 nm for 60 seconds through a gray scale having a tonal range of 0.15 to 1.95, wherein the density increments amount to 0.15 (UGRA gray scale). Immediately after exposure, the plate was heated in an oven for 2 minutes at 90° C.

Then, the exposed plate was treated for 30 seconds with a developer solution comprising the following components:
  3.4 parts by weight Rewopol NLS 28® (available from the company REWO)
  1.1 parts by weight diethanol amine
  1.0 parts by weight Texapon 842® (available from the company Henkel)
  0.6 parts by weight Nekal BX Paste® (available from the company BASF)
  0.2 parts by weight 4-toluene sulfonic acid and
  93.7 parts by weight water Then the developer solution was again rubbed over the surface for another 30 seconds using a tampon and then the entire plate was rinsed with water. After this treatment, the exposed portions remained on the plate. For the assessment of its photosensitivity, the plate was blackened in a wet state with printing ink.

For the assessment of storage stability, the unexposed printing plate precursors were stored for 60 minutes in a 90° C. oven, then exposed and developed as described above (storage stability test).

For evaluating the latitude during preheating, the exposed plates were heated in an infrared heating device NE459/125P from BasysPrint at a plate rate of 60 cm/min, and the temperature on the plate surface, measured with a temperature strip on the back of the plate, was 140° C. (preheating latitude test).

For the preparation of a lithographic printing plate, a printing layer was applied to the aluminum foil, as explained above, exposed, heated, developed, and after rinsing with water, the developed plate was rubbed with an aqueous solution of 0.5% phosphoric acid and 6% gum arabic. The thus prepared plate was loaded in a sheet-fed offset printing machine and used for printing with an abrasive printing ink (Offset S 7184 available from Sun Chemical, containing 10% potassium carbonate).

The results are summarized in Table 2.

In order to illustrate the sorption of the stabilizer on the surface of the lithographic plate, the following experiments were carried out (Table 3):

The photopolymer layer was applied on the lithographic substrate (Al foil) such that a dry layer weight of 2 g/m², as described above, was obtained; the compositions of the samples were the same as described in Table 1 and Table 2. An oxygen-impermeable overcoat with a dry layer weight of 3 g/m² was applied on the photopolymer layer.

The overcoat was washed with H₂O.

The photopolymer layer on the Al foil was removed with methyl ethyl ketone (20 ml methyl ethyl ketone per 500 cm²).

The photopolymer layer was applied onto a polyester film and a dry layer weight of 2 g/m² was obtained. As in the case of the Al foil, an oxygen-impermeable overcoat with a dry layer weight of 3 g/m² was applied here as well;

The overcoat was washed.

The photopolymer layer on the polyester film was removed with methyl ethyl ketone (20 ml methyl ethyl ketone per 500 cm²).

EPR spectra were recorded of the two samples of removed photopolymer layer (one removed from the Al foil and the second one removed from the polyester film) and the signal intensities were compared. The resulting EPR spectra showed a typical interpolation spectrum with hyperfine splitting of about 13.7 Gauss and a g-value of about 2.0051. By integrating the signal intensity of the sample of the photopolymer layer removed from the lithographic substrate (S1) and the sample of the photopolymer layer removed from the polyester film (S2) the amount of nitroxyl radicals was calculated. The value of the polyester sample from which the photopolymer layer had been removed was used as a reference and was determined to be 100%. The percentage of sorbed nitroxyl radicals was calculated as follows:

$$R\% = 100\% - (S1/S2)*100\%$$

The results are summarized in Table 3.

The results summarized in Table 3 clearly show that the stabilizers according to the present invention were sorbed at the surface of the lithographic plate to a degree of almost 100%. The nitroxyl radical compounds of Comparative Examples 1 to 8 and 11 to 14 showed practically no interaction with the surface of the lithographic substrate.

Furthermore, it can be inferred from Table 2 that the use of the stabilizers improved the storage stability and the heating latitude without essentially affecting the sensitivity. Although stabilizers without functional groups capable of sorption at the substrate surface improve the storage stability and the heating latitude in some cases, they considerably impair sensitivity.

In conclusion, both the inhibitor group and the sorption groups are essential for an additive leading to improved storage stability and a larger heating latitude without affecting the photosensitivity of the plate.

TABLE 2

| Example | Stabilizer applied as component of the radiation-sensitive mixture[8] | Stabilizer applied between lithographic substrate and radiation-sensitive layer[8] | Gray scale 532 nm[1] 10 min | Gray scale 532 nm[1] 60 min/90°[6] | Gray scale 532 nm[1] 140° C./60 min[7] | Printing results |
|---|---|---|---|---|---|---|
| Comp. 1 | none | none | 3/8 to 9 | 3/7 | not developable | abrasion visible after 170,000 copies |
| 1 | 0.00005 g TEMPO phosphate | none | 3/8 | 3/8 | 3/8 | abrasion visible after 170,000 copies |
|  | 0.00010 g TEMPO phosphate | none | 3/8 | 3/8 | 3/8 | not determined |
|  | 0.00015 g TEMPO phosphate | none | 3/8 | 3/8 | 3/8 | abrasion visible after 160,000 copies |
| 2 | 0.0005 g copolymer acc. to Preparation Example 1 | none | 3/8 | 3/8 | 3/8 | abrasion visible after 160,000 copies |
| 3 | none | 0.0006 g/m² TEMPO phosphate | 3/8 to 9 | 3/8 | 3/8 | abrasion visible after 180,000 copies |
| 4 | none | 0.0012 g/m² copolymer according to Preparation Example 1 | 3/8 | 3/8 | 3/8 | abrasion visible after 170,000 copies |
| Comp. 2 | 0.0015 g OH TEMPO | none | 2/8 | 1/5 to 6 | 1/5 to 6 | abrasion visible after 130,000 copies |
| Comp. 3 | none | 0.0006 g/m² OH-TEMPO | 2/6 | 2/6 | 3/6 | abrasion visible after 140,000 copies |
| Comp. 4 | 0.0025 g TEMPO | none | 2/6 | 2/5 | not developable | not determined |
| Comp. 5 | 0.0025 g TEMPO phosphate ester | none | 2/6 | 2/5 | not developable | abrasion visible after 120,000 copies |
| Comp. 6 | 0.0006 g carboxy-proxyl | none | 2/8 | 2/6 | not developable | not determined |
|  | 0.00125 g carboxy-proxyl | none | 2/6 | 2/6 | 1/6 | abrasion visible after 100,000 copies |
| Comp. 7 | 0.00005 g NH₂ TEMPO | none | 2/7 | 2/6 | not developable | not determined |
|  | 0.0001 g NH₂ TEMPO | none | 2/6 | 2/5 | 1/4 | not determined |
| Comp. 8 | 0.000125 g CGS-160 | none | 2/6 | 1/4 | not developable | not determined |
|  | 0.0005 g CGS-160 | none | 1/3 | 1/2 | 1/2 | not determined |
| Comp. 9 | 0.0001 g 4-methoxyphenol | none | 3/6 | 3/6 | not developable | abrasion visible after 120,000 copies |
| Comp. 10 | 0.005 g Irganox 1010[4] | none | 2/6 | 2/6 | not developable | abrasion visible after 120,000 copies |
| Comp. 11 | 0.00025 g polymer with TEMPO groups according to WO 96/34314[2] | none | 2/6 | 2/5 | not developable | abrasion visible after 150,000 copies |
|  | 0.0005 g polymer with TEMPO groups according to WO 96/34314[2] | none | 2/4 | 2/4 | 2/3 | abrasion visible after 140,000 copies |
| Comp. 12 | [3] | none | 3/6 | 3/6 | not developable | abrasion visible after 140,000 copies |
| Comp. 13 | Q-1301 | none | 2/5 | 2/5 | not developable | abrasion visible after 110,000 copies |
| Comp. 14 | 0.050 g phosphoric acid | none | 3/6 | 2/5 | not developable | not determined |

Footnotes for Table 2

[1] The first value indicates the solid steps of the blackened gray scale and the second value indicates the first step that did not accept printing ink.

[2] The polymer was prepared according to WO 96/34314 by reacting an maleic acid anhydride ethylene copolymer with 4-amino TEMPO and taurine

[3] 0.05% of the polymer described in [2] above were present in the overcoat.

[4] Irganox 1010 is a commercially available inhibitor of the company CIBA Specialities/Switzerland; it is pentaerythritol-tetrakis-(3-(3,5-di-tert-butyl-4-hydroxyphenyl)propionate).

[5] Q-1301 is a commercially available inhibitor of the company Wako Chemicals Ltd./Japan; it is N-nitrosophenylhydroxylamine-aluminum salt.

[6] Storage stability: Result obtained after 60 minute storage of the unexposed plate precursor at 90° C.

[7] Preheating latitude test: Result obtained after the exposed plate passed through a 140° C. oven.

[8] The abbreviations of the additives have the following meaning:

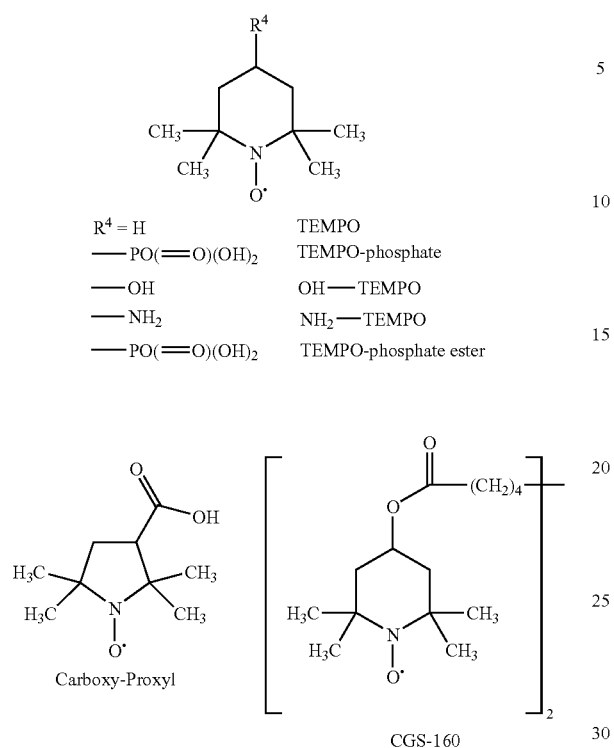

Carboxy-Proxyl

CGS-160

TABLE 3

| EPR Test No. | Additive X in the coating solution | Additive Y applied between lithographic substrate and photopolymer layer | R % |
|---|---|---|---|
| 1 | none | none | no signal obtained |
| 2 | 0.0025 TEMPO phosphate | none | 98% |
| 3 | 0.0075 g copolymer according to Preparation Example 1 | none | 95% |
| 4 | none | 0.001 g/m² TEMPO phosphate | 100% |
| 5* | 0.0025 g OH TEMPO | none | <5% |
| 6* | 0.0025 TEMPO | none | <5% |
| 7* | 0.0025 g TEMPO phosphate ester | none | <5% |
| 8* | 0.00125 g carboxy-proxyl 0.0025 carboxy-proxyl | none none | <5% <5% |
| 9* | 0.0025 g NH₂ TEMPO | none | <5% |
| 10* | 0.00125 g CGS-169 0.005 g CGS-169 | none none | <5% <5% |
| 11* | 0.0075 g polymer with TEMPO groups according to WO 96/34314²⁾ | none | <5% |

*Comparison

The invention claimed is:

1. A radiation-sensitive element comprising
   (a) a substrate with at least one hydrophilic surface and
   (b) a radiation-sensitive coating on at least one hydrophilic surface of the substrate, wherein the coating comprises:
      (i) at least one free-radical polymerizable monomer, oligomer, polymer or mixture thereof with at least one ethylenically unsaturated group each,
      (ii) at least one photoinitiator or sensitizer, which is capable of absorbing radiation of a wavelength in the range of 250 to 1,200 nm,
      (iii) at least one stabilizer compound comprising at least one group capable of inhibiting free-radical polymerization, and at least one other group capable of sorption at the hydrophilic surface of the substrate, wherein the stabilizer compound is a monomeric compound, and
      (iv) optionally at least one additive comprising coinitiators which form free radicals after the excitation of the photoinitiator or sensitizer with radiation of a wavelength of 250 to 1,200 nm, binders, dyes, plasticizers, chain transfer agents, leuco dyes, inorganic fillers, surfactants or polymerization inhibitors not suitable for sorption at the surface of the substrate,
   wherein the at least one group of the stabilizer compound capable of sorption at the surface of the substrate is:

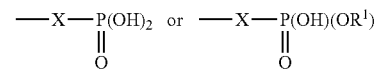

wherein $R^1$ is $C_1$-$C_{18}$ aralkyl or $C_6$-$C_{10}$ aryl and X represents a single bond, —O—, —NH— or —N($C_1$-$C_{10}$ alkyl)-.

2. The radiation-sensitive element according to claim 1, wherein the monomeric stabilizer compound is represented by formula M1:

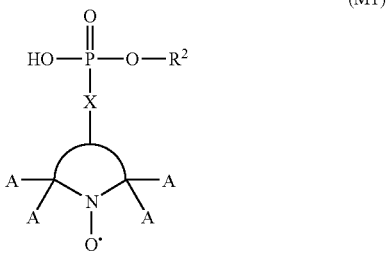

(M1)

wherein X represents a single bond, —O—, —NH— or —N($C_1$-$C_{10}$ alkyl)-, $R^2$ is hydrogen, $C_1$-$C_{18}$ alkyl, $C_7$-$C_{11}$ aralkyl, $C_6$-$C_{10}$ aryl or a fragment

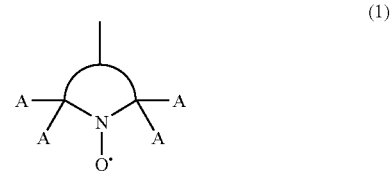

(1)

wherein each A is independently optionally substituted $C_1$-$C_{10}$ alkyl and the nitroxyl function is part of a 5- or 6-membered heterocyclic ring, which optionally comprises one or more double bonds and optionally contains, in addition to the nitrogen atom of the nitroxyl group, one or more O, S or N heteroatoms.

3. The radiation-sensitive element according to claim 2, wherein the fragment

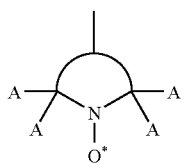
(I)

is represented by formulas Ia-If

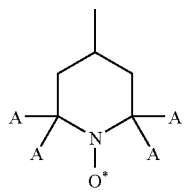
(Ia)

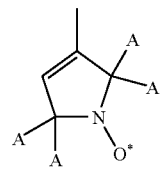
(Ib)

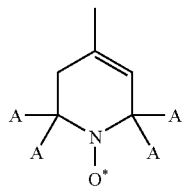
(Ic)

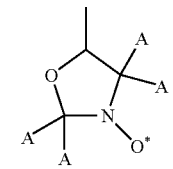
(Id)

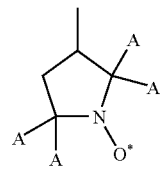
(Ie)

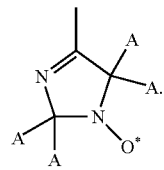
(If)

4. The radiation-sensitive element according to claim 2, wherein X represents —O—.

5. The radiation-sensitive element according to claim 2, wherein $R^2$ is a hydrogen atom.

6. The radiation-sensitive element according to claim 2, wherein A is methyl.

7. A radiation-sensitive element comprising
(a) a substrate with at least one hydrophilic surface and
(b) a radiation-sensitive coating on at least one hydrophilic surface of the substrate, wherein the coating comprises:
(i) at least one free-radical polymerizable monomer, oligomer, polymer or mixture thereof with at least one ethylenically unsaturated group each,
(ii) at least one photoinitiator or sensitizer, which is capable of absorbing radiation of a wavelength in the range of 250 to 1,200 nm,
(iii) at least one stabilizer compound comprising at least one group capable of inhibiting free-radical polymerization, and at least one other group capable of sorption at the hydrophilic surface of the substrate, and
(iv) optionally at least one additive comprising coinitiators which form free radicals after the excitation of the photoinitiator or sensitizer with radiation of a wavelength of 250 to 1,200 nm, binders, dyes, plasticizers, chain transfer agents, leuco dyes, inorganic fillers, surfactants or polymerization inhibitors not suitable for sorption at the surface of the substrate, wherein the element further comprises an oxygen-impermeable overcoat.

8. A process for the production of a radiation-sensitive element comprising the steps of:
(a) providing an optionally pretreated substrate having a hydrophilic surface;
(b) applying to said optionally pretreated substrate having a hydrophilic surface, a radiation-sensitive mixture comprising
(i) at least one free-radical polymerizable monomer, oligomer, polymer or mixture thereof with at least one ethylenically unsaturated group each,
(ii) at least one photoinitiator or sensitizer, which is capable of absorbing radiation of a wavelength in the range of 250 to 1,200 nm,
(iii) at least one stabilizer compound comprising at least one group capable of sorption at the hydrophilic surface of the substrate, and at least one other group capable of inhibiting free-radical polymerization,
wherein the at least one group of the stabilizer compound capable of sorption at the surface of the substrate is:

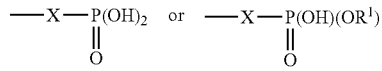

wherein $R^1$ is $C_1$-$C_{18}$ alkyl, $C_7$-$C_{11}$ aralkyl or $C_6$-$C_{10}$ aryl and X represents a single bond, —O—, —NH— or —N($C_1$-$C_{10}$ alkyl)-,
(iv) a solvent or solvent mixture, and
(v) optionally at least one additive comprising coinitiators which form free radicals after the excitation of the photoinitiator or sensitizer with radiation of a wavelength of 250 to 1,200 nm, binders, dyes, plasticizers, chain transfer agents, leuco dyes, inorganic fillers, surfactants or polymerization inhibitors not suitable for sorption at the surface of the substrate; and c) drying the layer obtained in step (b).

9. The process according to claim 8, wherein the process further comprises the step of applying an oxygen-impermeable overcoat to the layer dried in step (c).

10. A process for the production of a radiation-sensitive element comprising the steps of:
   (a) providing an optionally pretreated substrate having a hydrophilic surface;
   (b) applying to said optionally pretreated substrate having a hydrophilic surface, a mixture that is not radiation-sensitive comprising at least one solvent and at least one stabilizer compound comprising at least one group capable of sorption at the substrate and at least one group capable of inhibiting free-radical polymerization;
   wherein the at least one group of the stabilizer compound capable of sorption at the surface of the substrate is:

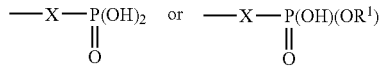

wherein $R^1$ is $C_1$-$C_{18}$ alkyl, $C_7$-$C_{11}$ aralkyl or $C_6$-$C_{10}$ aryl and X represents a single bond, —O—, —NH— or —N($C_1$-$C_{10}$ alkyl)-,
   (c) drying the layer obtained in step (b);
   (d) applying to the dried layer obtained in step (c), a radiation-sensitive mixture comprising
      (i) at least one free-radical polymerizable monomer, oligomer, polymer or mixture thereof with at least one ethylenically unsaturated group,
      (ii) at least one photoinitiator or sensitizer, which is capable of absorbing radiation of a wavelength in the range of 250 to 1,200 nm,
      (iii) a solvent or solvent mixture, and
      (iv) optionally at least one additive comprising coinitiators which form free radicals after the excitation of the photoinitiator or sensitizer with radiation of a wavelength of 250 to 1,200 nm, binders, dyes, plasticizers, chain transfer agents, leuco dyes, inorganic fillers, surfactants or polymerization inhibitors not suitable for sorption at the surface of the substrate; and
   (e) drying the layer obtained in step (d).

11. The process according to claim 10, wherein the process further comprises the step of applying an oxygen-impermeable overcoat to the layer dried in step (e).

12. Lithographic printing form produced by a process comprising the steps of:
   (a) providing a radiation-sensitive element comprising:
      (1) a substrate with at least one hydrophilic surface and
      (2) a radiation-sensitive coating on at least one hydrophilic surface of the substrate, wherein the coating comprises:
         (i) at least one free-radical polymerizable monomer, oligomer, polymer or mixture thereof with at least one ethylenically unsaturated group each,
         (ii) at least one photoinitiator or sensitizer, which is capable of absorbing radiation of a wavelength in the range of 250 to 1,200 nm,
         (iii) at least one stabilizer compound comprising at least one group capable of inhibiting free-radical polymerization, and at least one other group capable of sorption at the hydrophilic surface of the substrate,
      wherein the at least one group of the stabilizer compound capable of sorption at the surface of the substrate is:

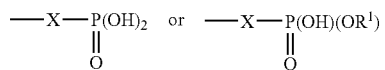

wherein $R^1$ is $C_1$-$C_{18}$ alkyl, $C_7$-$C_{11}$ aralkyl or $C_6$-$C_{10}$ aryl and X represents a single bond, —O—, —NH— or —N($C_1$-$C_{10}$ alkyl)-, and
         (iv) optionally at least one additive comprising coinitiators which form free radicals after the excitation of the photoinitiator or sensitizer with radiation of a wavelength of 250 to 1,200 nm, binders, dyes, plasticizers, chain transfer agents, leuco dyes, inorganic fillers, surfactants or polymerization inhibitors not suitable for sorption at the surface of the substrate;
   (b) image-wise exposure of the element with radiation of a wavelength adjusted to the absorber contained in the radiation-sensitive coating;
   (c) optionally heating the irradiated element;
   (d) removing the unexposed areas of the coating with an aqueous alkaline developer; and
   (e) optionally heating the developed printing form or subjecting it to overall exposure or both.

* * * * *

UNITED STATES PATENT AND TRADEMARK OFFICE
CERTIFICATE OF CORRECTION

PATENT NO. : 7,285,372 B2  
APPLICATION NO. : 10/536514  
DATED : October 23, 2007  
INVENTOR(S) : Eduard Kottmair et al.

It is certified that error appears in the above-identified patent and that said Letters Patent is hereby corrected as shown below:

Col. 22, line 35     In Claim 1, after "C1-C18" insert -- alkyl, C7-C11 --.  
Col. 22, line 60     In Claim 2, delete "(1)" and insert -- (I) --, therefor.

Signed and Sealed this

Fifteenth Day of April, 2008

JON W. DUDAS  
*Director of the United States Patent and Trademark Office*